United States Patent
Seo et al.

(10) Patent No.: US 6,252,817 B1
(45) Date of Patent: Jun. 26, 2001

(54) READ ONLY MEMORY WITH NEIGHBORING MEMORY BLOCKS SHARING BLOCK SELECTION LINES

(75) Inventors: Yong-Seok Seo, Seoul; Byeng-Sun Choi, Kyunggi-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/361,490

(22) Filed: Jul. 26, 1999

(30) Foreign Application Priority Data

Jul. 25, 1998 (KR) .................................................. 98-30052

(51) Int. Cl.$^7$ ...................................................... G11C 8/00
(52) U.S. Cl. ........................ 365/230.03; 365/51; 365/63
(58) Field of Search ............................ 365/230.03, 63, 365/51, 185.05, 185.11

(56) References Cited

U.S. PATENT DOCUMENTS

| | | | |
|---|---|---|---|
| 5,245,570 | * 9/1993 | Fazio et al. | 365/230.03 |
| 5,706,245 | * 1/1998 | Kim | 365/230.03 |
| 5,825,683 | * 10/1998 | Chang | 365/63 |
| 5,943,289 | * 8/1999 | Ahn et al. | 365/230.06 |
| 6,034,911 | * 3/2000 | Aimoto et al. | 365/230.03 |

* cited by examiner

*Primary Examiner*—Richard Elms
*Assistant Examiner*—VanThu Nguyen
(74) *Attorney, Agent, or Firm*—Marger Johnson & McCollom, P.C.

(57) ABSTRACT

A memory comprising a plurality of memory blocks having a plurality of memory cells and wordlines, each of the memory blocks having selection lines by which the memory blocks are selected. The selection lines are shared between neighboring blocks. In addition, a wordline switching circuit is coupled between conductors carrying wordline drive signals and the wordlines, and a block selection line circuit is coupled between conductors carrying the block selection lines signals and the block selection lines. A selection control circuit supplies selection control signals to the wordline switching circuit and the block selection line switching circuit. The selection control circuit generates the selection control signals in response to address informing signals. The selection lines are coupled to discharge circuits, which pull down voltage levels of selection lines that are not selected.

2 Claims, 8 Drawing Sheets

Fig. 7

| Selected block for reading | GSLi-1<0> GSLi<1> | WLTn WLT0 | BSLi<0> BSLi<1> | WLB0 WLBn | GSLi<0> GSLi+1<1> |
|---|---|---|---|---|---|
| block BKTi | Valid | Valid | Valid | Ground | Ground |
| block BKBi | Ground | Ground | Valid | Valid | Valid |
| block BKBi-1 | Valid | Ground | Ground | Ground | Ground |
| block BKBi+1 | Ground | Ground | Ground | Ground | Valid |
| None | Ground | Ground | Ground | Ground | Ground |

READ ONLY MEMORY WITH NEIGHBORING MEMORY BLOCKS SHARING BLOCK SELECTION LINES

FIELD OF THE INVENTION

The present invention relates to a read only memory, and more particularly to a semiconductor read only memory in which a selected memory block shares its assigned block selection lines with its neighboring memory block.

BACKGROUND OF THE INVENTION

Mask ROMs with NOR-type memory cell arrays has been disclosed in Symposium on VLSI Circuit on August 1988, entitled 16 Mb ROM Design Using Bank Select Architecture, pp.85–88, in which bit lines are constructed in a hierarchical arrangement. In the technique of the article, the reading-out process is accomplished through three steps: (a) precharging main bit lines into predetermined voltage levels; (b) sensing a voltage level of a main bit line to determine whether a selected memory cell is an on-cell or an off-cell; and (c) outputting data detected from the selected memory cell to the output of the memory device. Each of the banks has bank selection transistors which connect memory cells to bit lines and ground lines.

In a typical architecture of the mask ROM, bank selection transistors are controlled by bank selection lines and ground selection lines. These are arranged between the memory banks, which take up space. It is desired to find arrangements that save space so that the memory can become more compact.

SUMMARY OF THE INVENTION

Accordingly, it is an object of the invention to provide a read-only memory having an efficient architecture in selecting and activating memory banks. This is accomplished by having neighboring memory blocks share the block selection lines that are between them.

More specifically, a memory of this invention includes a plurality of memory blocks having a plurality of memory cells arranged in a matrix type. The memory cells are coupled to a plurality of wordlines. A plurality of selection lines is disposed between the memory blocks. The selection lines are divided into a plurality of groups, and each of the groups is shared by neighboring memory blocks. The memory includes means for selecting a corresponding one of the groups in response to address informing signals.

Other aspects of the present invention are a wordline switching circuit coupled between conductors carrying wordline drive signals and the wordlines and, a block selection line switching circuit coupled between the block selection line signals and the conductors block selection carrying lines. A switching control circuit supplies selection control signals to the wordline switching circuit and the block selection line circuit. The switching control circuit generates the selection control signals in response to address informing signals.

In a preferred feature of the invention, the wordline switching circuit, the block selection line switching circuit, the switching control circuit and the discharge circuit are provided in a decoding unit.

The invention preferably also includes discharge circuits. The selection lines are coupled to the discharge circuits, which pull down voltage levels of the selection lines that are not selected in response to the block selection control signal.

Since the block selection lines are shared, fewer are needed between the memory blocks. This and other features and advantages of the invention will be understood better in connection with the Detailed Description of the invention and drawings.

BRIEF DESCRIPTION OF THE DRAWINGS

For a better understanding of the invention, and to show how embodiments of the same may be carried into effect, reference will now be made, by way of example, to the accompanying diagrammatic drawings, in which:

FIG. 7 is a truth table for a block decoder unit of FIG. 1 to operate for addressing different memory blocks of FIG. 2.

In the figures, like reference numerals denote like or corresponding parts.

DETAILED DESCRIPTION OF PREFERRED EMBODIMENTS

Embodiments of the invention are now described in detail in connection with the appended drawings.

Figure 1:
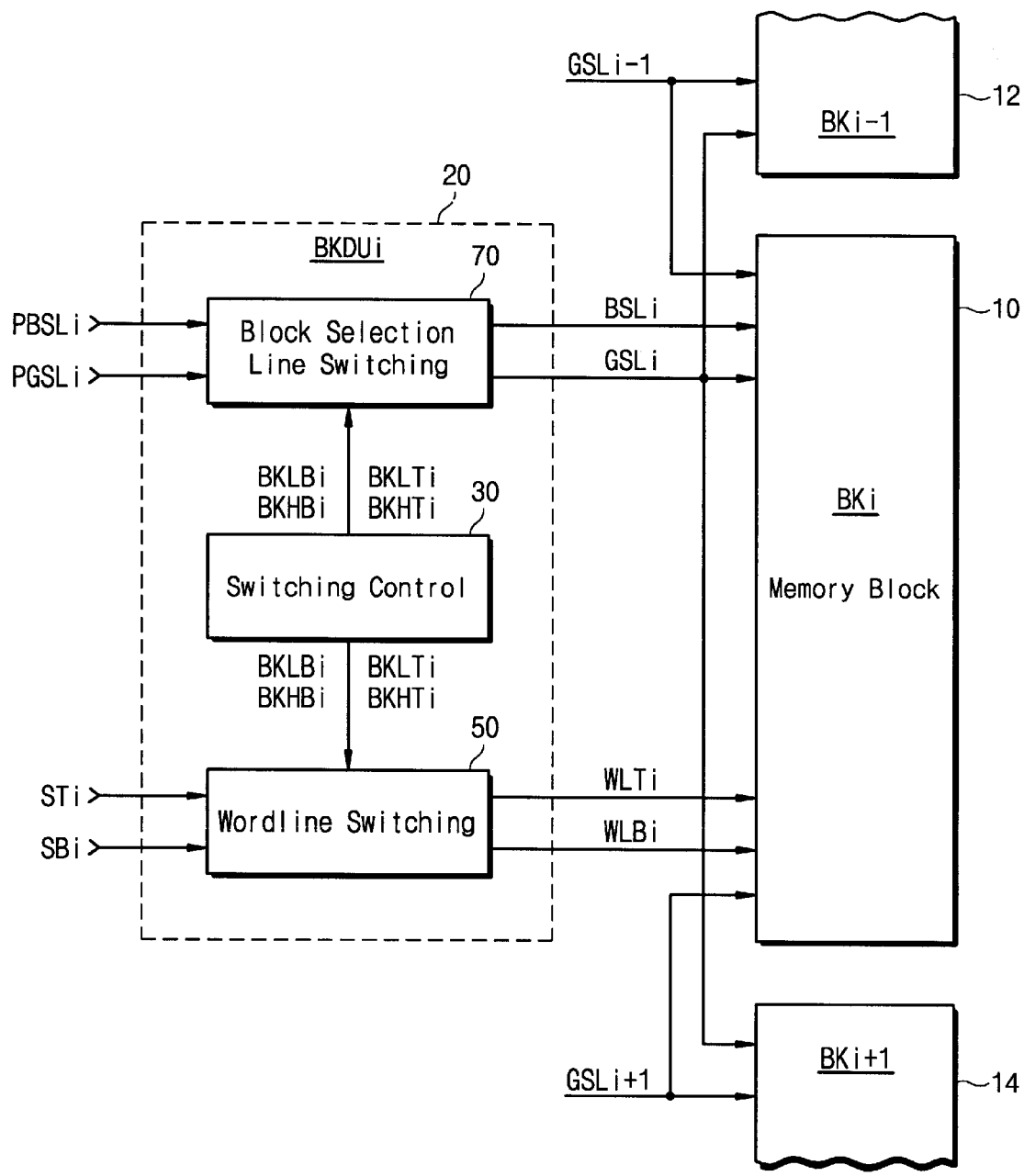
FIG. 1 is a functional block diagram of a read only memory made according to the invention.

FIG. 1 shows a functional block diagram of an embodiment of the invention. Memory block 10 is designated as BKi, and has neighboring blocks BKi−1 12 and BKi+1 14.

The invention provides a block decoding unit for each memory block. They are coupled as shown in FIG. 1. Specifically, block 10 is coupled with a corresponding block decoding unit 20, designated as BKDUi. The block decoding unit includes a wordline switching circuit 50 and block selection line switching circuit 70, both of which are controlled by switching control circuit 30.

Switching control circuit 30 generates block selection control signals, BKLBi, BKLTi, BKHBi, and BKHTi. The block selection control signals are applied into wordline switching circuit 50 and block selection line switching circuit 70. In response, selection circuit 70 activates and deactivates the block selection lines BSLi and ground selection lines GSLi, that transfer the block selection signals which address memory block 10. Similarly, wordline switching circuit 50 transfers wordline driving signals STi and SBi to wordlines WLTi and WLBi (i=0 to n), in response to the same block selection control signals.

Figure 2:
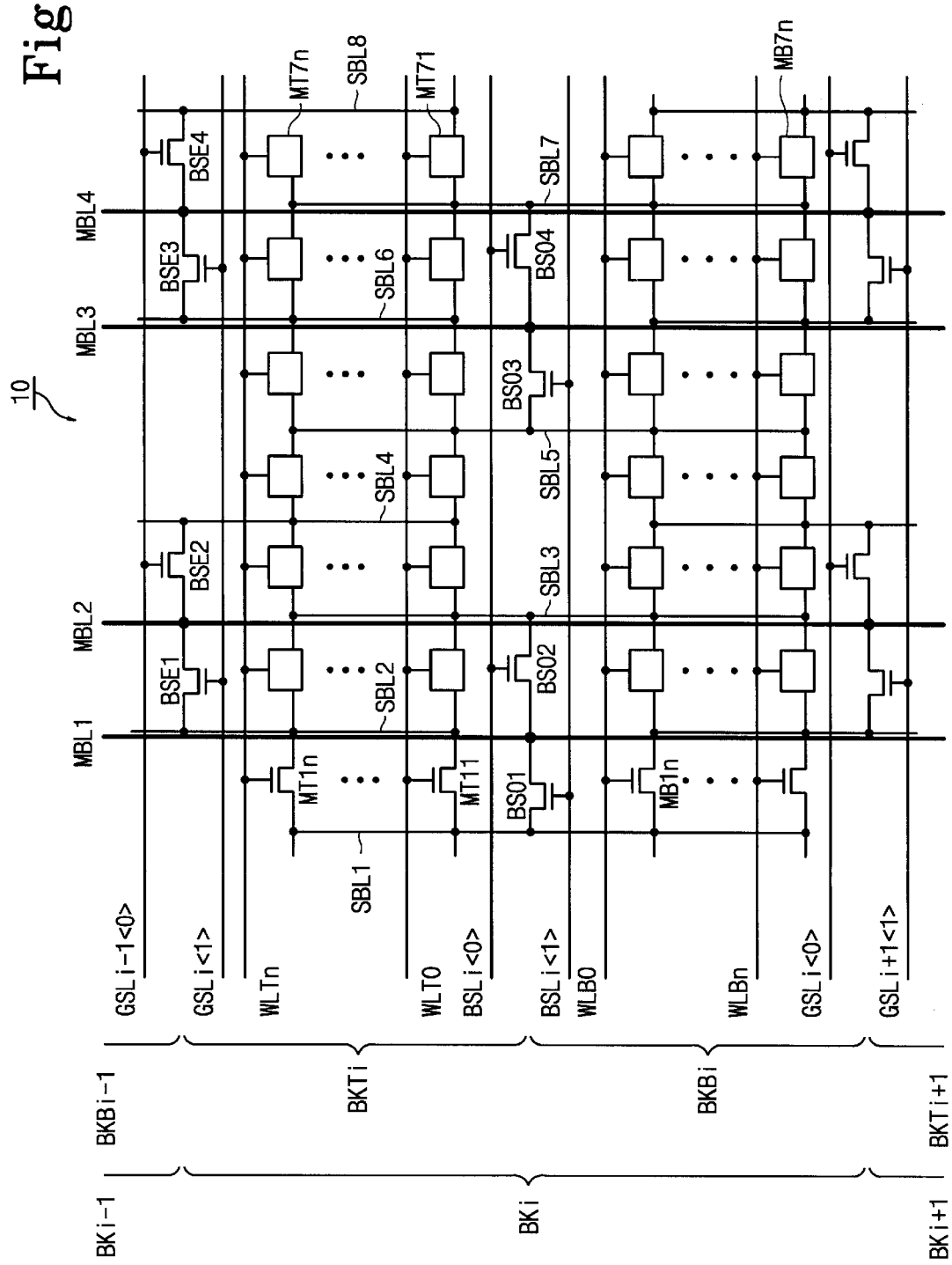
FIG. 2 is a circuit diagram of the memory blocks of FIG. 1.

Referring to FIG. 2, the memory block BKi is divided into top block BKTi and bottom block BKBi that are neighboring to each other. In addition, top block BKTi is neighboring to bottom block BKBi−1 of memory block BKi−1, and bottom block BKBi is neighboring to top block BKTi+1 of memory block BKi+1.

The block BKi is formed of main bitlines MBL1 to MBL4, sub-bitlines SBL1 to SBL8, memory cells MT11 . . . , and selection transistors BSLE1 . . BSLO1 . . . . The arrangement of bitlines is constructed of main bitlines MBL1–MBL4, and sub-bitlines SBL1–SBL8.

One of the odd-numbered main bitlines MBL1 and MBL3 are connected to two of the odd-numbered sub-bitlines, each through two of odd-numbered block selection transistors BSO1–BSO4. The gates of BSO1 and BSO3 are coupled with block selection line BSLi<1>, and the gates of BS02 and BS04 are coupled with BSLi<0>. Similarly, one of the even-numbered main bitlines MBL2 and MBL4 is connected to two of the even-numbered sub-bitlines, each through two of even-numbered block selection transistors BSE1–BSE4. The gates of BSE1 and BSE3 are coupled with ground selection line GSLi<1>, and the gates of BSE2 and BSE4 are coupled with GSLi-1<0>.

The wordlines are divided into those for the top (WLTi) and those for the bottom (WLBi) intersecting the main bit lines is coupled to control gates of the memory cells that are arranged in a row direction. Each of the sub-bitlines is coupled to sources and drains of neighboring memory cells.

As shown in FIG. 2, the block and ground selection lines and the selection transistors are shared by the neighboring blocks. The feature of activating the block and ground selection lines for each memory block is described with reference to FIG. 6.

The components of block decoding unit BKDUi 20 are now described. Switching control circuit 30 includes a pair of circuits. These circuits are now described on circuits 30a and 30b, with reference to FIG. 3A. These circuits are for generating selection control signals BKLTi and BKHTi, which are used in selecting the top block and control signals BKLBi and BKHBi are used for selecting the bottom block. Circuits 30a, 30b respond to address informing signals, and use a high voltage as a power supply voltage.

Figure 3A:
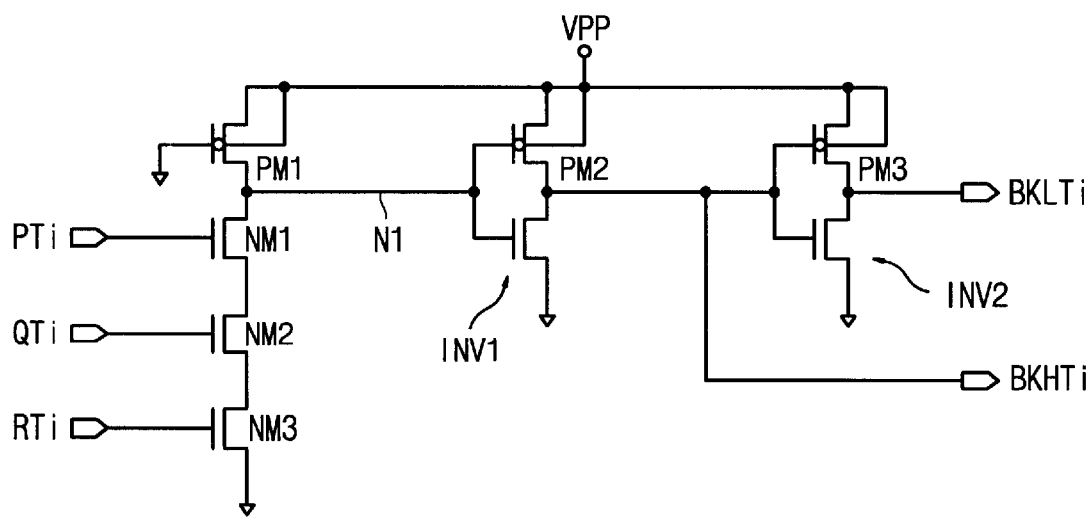
FIGS. 3A and 3B are diagrams for circuits for generating switching control signals for signals involved in block selection for the memory of FIG. 1.

Referring to FIG. 3A, address informing signals PTi, QTi, and RTi are coupled respectively to gates of NMOS transistors NM1, NM2, and NM3, which are connected serially between node N1 and a substrate voltage in serial. PMOS transistor PM1 is connected between high voltage VPP (or a pumped voltage) and node N1, gate of which being held in the substrate voltage. Signal BKHTi appears at an output of CMOS inverter INV1 whose input is connected to node N1, and signal BKLTi (a logically reverse signal of BKHTi) is generated from an output of CMOS inverter INV2 whose input is BKHTi. The power supply source of the CMOS inverters is the high voltage VPP.

Figure 3B:
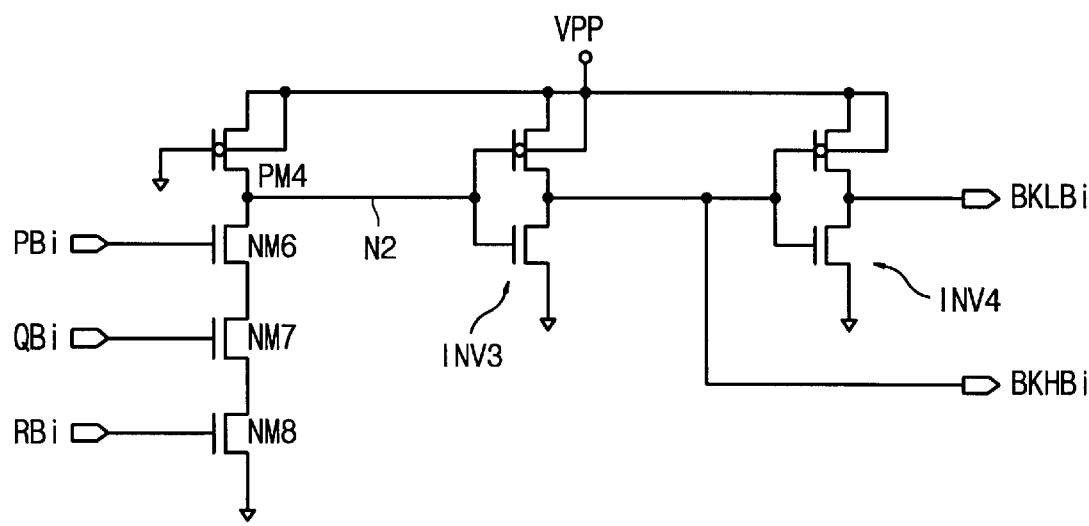

In FIG. 3B, address informing signals PBi, QBi, and RBi are each coupled respectively to gates of NMOS transistors NM6, NM7, and NM8, which are connected serially between node N2 and the substrate voltage. PMOS transistor PM4 is connected between VPP and node N2, the gate of which is held at the substrate voltage. Signal BKHBi appears at an output of CMOS inverter INV3, whose input is connected to node N2, and signal BKLBi (a logically reverse signal of BKHBi) is generated from an output of CMOS inverter INV4, whose input is BKHBi. The power supply source of the CMOS inverters is the high voltage VPP.

Figure 4A:
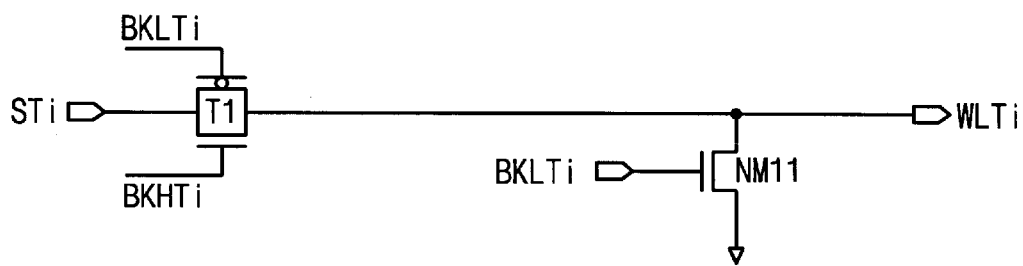
FIGS. 4A and 4B are circuit diagrams of wordline switching circuits for the memory of FIG. 1.

Wordline switching circuit 50 has two identical circuits. The first circuit, shown in FIG. 4A, is for connecting wordline drive signal STi into wordlines WLTi, which are arranged in the top block. The second circuit, shown in FIG. 4B, is for connecting wordline drive signal SBi into wordlines WLBi, which are arranged in the bottom block.

Referring to FIG. 4A, STi is coupled through to WLTi through CMOS transmission gate T1. In gate T1, a PMOS gate is coupled to BKLTi, and an NMOS gate is coupled to BKHTi. WLTi is connected to drain of NMOS transistor NM11, whose source and gate are each coupled to the substrate voltage and BKLTi.

Figure 4B:
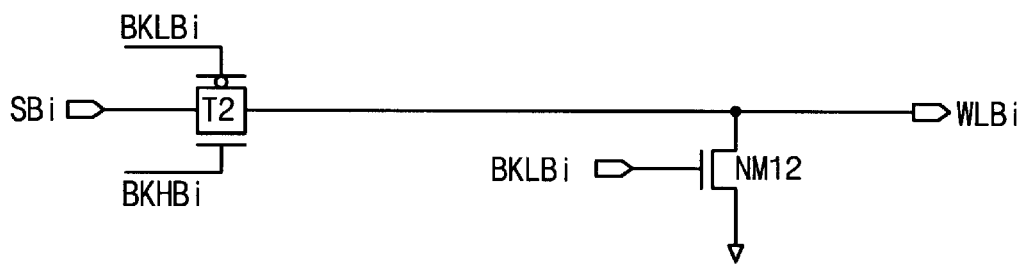

In FIG. 4B, SBi is coupled through to WLBi through CMOS transmission gate T2. In gate T2, a PMOS gate is coupled to BKLBi, and an NMOS gate is coupled to BKHBi. WLBi is connected to drain of NMOS transistor NM12, whose source and gate are each coupled to the substrate voltage and BKLBi.

Block selection line switching circuit 70 also has two identical circuits, one for the block selection lines and one the ground selection lines. Referring briefly to FIG. 2, it will be appreciated that these block selection lines and ground selection lines are arranged in groups. The lines of a single group go between a pair of neighboring blocks.

Figure 5A:
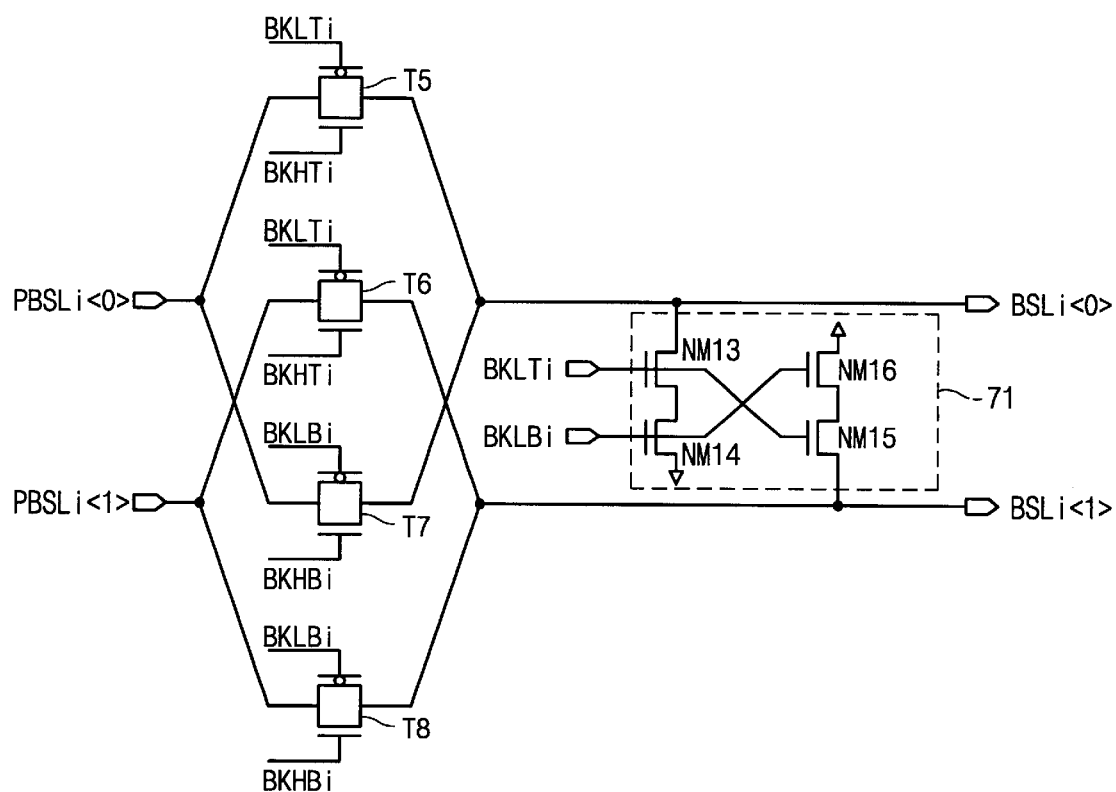
FIGS. 5A and 5B are circuit diagrams of block selection circuits for the memory of FIG. 1.

Referring to FIG. 5A, block selection line signal PBSLi<0>, which is shared by the top and bottom blocks, is connected through two split paths, each of which has a CMOS transmission gate, such as T5 and T7. PMOS and NMOS electrodes of gate T5 are each coupled to BKLTi and BKHTi. PMOS and NMOS electrodes of gate T7 are coupled to BKLBi and BKHBi, respectively. Between BSLi<0> and the substrate voltage, NMOS transistors NM13 and NM14 are connected in serial. Gates of NM13 and NM14 are coupled to BKLTi and BKLBi, respectively.

In addition, block selection line signal PBSLi<1>, which is also shared by the top and bottom blocks, is connected through two split paths, each of which has a CMOS transmission gate, such as T6 and T8. PMOS and NMOS electrodes of gate T6 are each coupled to BKLTi and BKHTi. PMOS and NMOS electrodes of gate T8 are coupled to BKLBi and BKHBi, respectively. Between BSLi<1> and the substrate voltage, NMOS transistors NM15 and NM16 are connected serially. Gates of NM15 and NM16 are coupled to BKLTi and BKLBi, respectively.

The NMOS transistors NM13 through NM16 form a discharge circuit, which pulls own voltage levels of BSLi<0> and BSLi<1> to the substrate voltage (or a ground voltage) hen BSLi<0> and BSLi<1> are not selected. (This is also known as being unselected.)

Figure 5B:
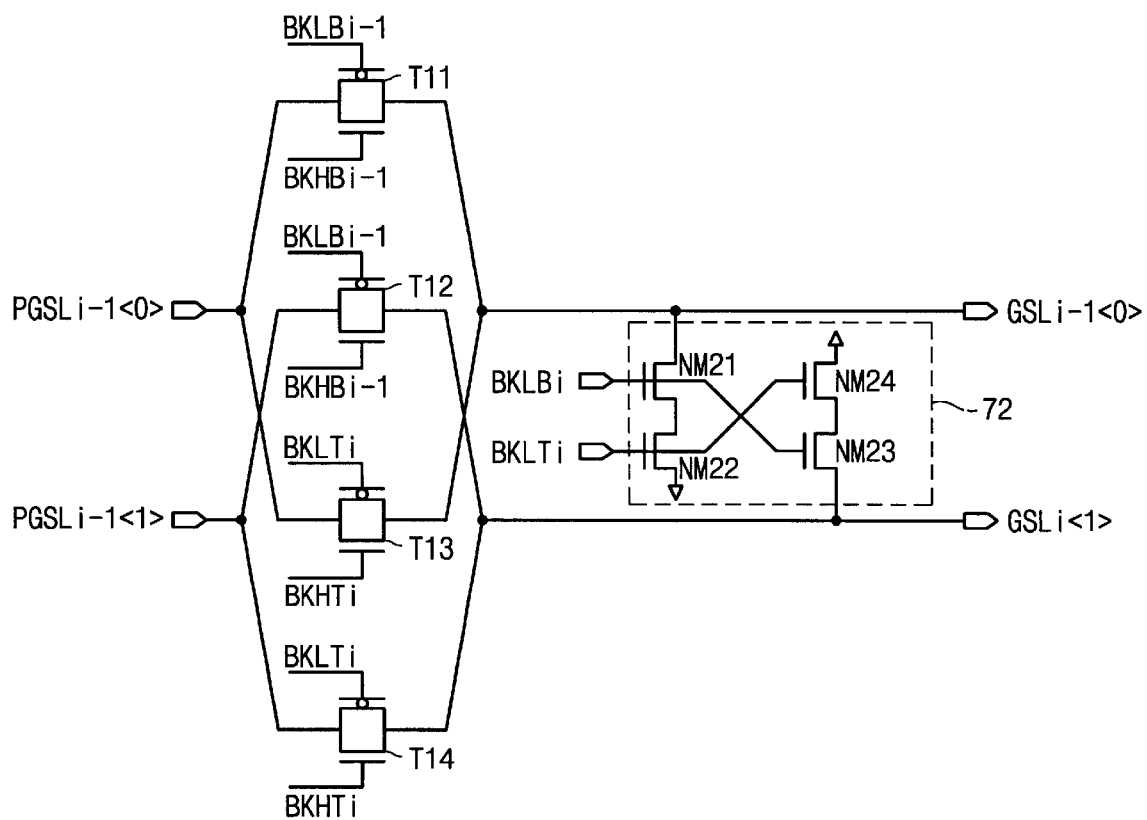

Referring to FIG. 5B, ground selection line signal PGSLi-1<0>, which is shared by BKTi and BKBi-1, is connected through two split paths, each of which has CMOS transmission gate, such as T11 and T13. PMOS and NMOS electrodes of gate T11 are each coupled to BKLBi-1 and BKHBi-1. PMOS and NMOS electrodes of gate T13 are coupled to KLTi and BKHTi, respectively. Between GSLi-1<0> and the substrate voltage, NMOS transistors NM21 and NM22 are connected serially. Gates of NM21 and NM22 are coupled to BKLBi and BKLTi, respectively.

In addition, ground selection line signal PGSLi<1>, which is shared by the same two blocks as GSLi<0>, is connected through two split paths that have CMOS transmission gates, such as T12 and T14. PMOS and NMOS electrodes of gate T12 are each coupled to BKLBi-1 and BKHBi-1. PMOS and NMOS electrodes of gate T14 are coupled to BKLTi and BKHTi, respectively. Between GSLi<1> and the substrate voltage, NMOS transistors NM23 and NM24 are connected serially. Gates of NM23 and NM24 are coupled to BKLBi and BKLTi, respectively. The NMOS transistors NM21 through NM24 form a discharge circuit which pulls down voltage levels of GSLi-1<0> and GSLi<1> to the substrate voltage (or to a ground voltage) when GSLi-1<0> and GSLi<1> are not selected.

The wordlines address cells in the matrix configuration. The block selection lines and the ground selection lines are sometimes collectively known as simply block selection lines. Another way of saying that these lines are shared between blocks is by acknowledging that the block selection line addresses at least one memory cell in each memory block.

Figure 6:
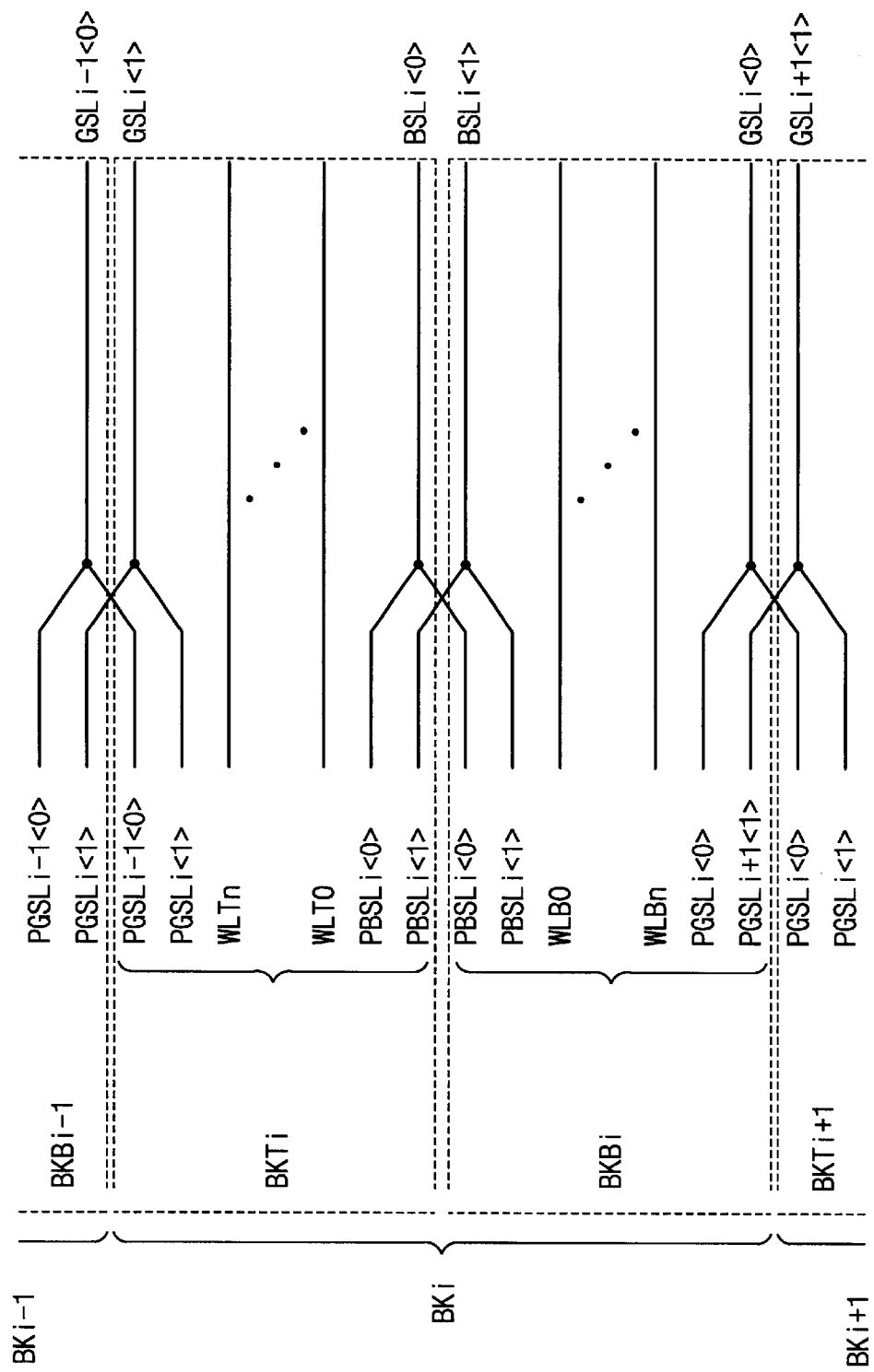
FIG. 6 is a schematic diagram illustrating a manner of sharing of block selection lines between neighboring blocks in the memory of FIG. 2.

FIG. 6 schematically shows a preferred configuration of which block and ground selection lines are used by which neighboring memory blocks. As shown in FIG. 6, these block selection and ground lines are shared in an alternatively switchable correlation, which coincides with the features of arrangement in FIGS. 5A and 5B. For instance, each of ground selection lines GSLi−1<0> and GSLi<1> is used by both blocks BKBi−1 and BKTi, while each of block selection lines BSLi<0> and BSLi<1> is used by both blocks BKTi and BKBi. These lines are shown as split, with a portion belonging in each of the blocks it serves. Meanwhile, each of ground selection lines GSLi<0> and GSLi+1<0>, disposed between blocks BKBi and BKTi+1, is constructed of the twin lines assigned to each of BKBi and BKTi+1 as the other selection line.

The twin selection lines are not activated at the same time, because an alternative selection between the split selection lines is controlled by the selection control signals, each of which responds to different address informing signals. As an example, referring to FIGS. 3A, 3B, and 5A, the complementary pair of selection control signals BKLTi and BKHTi, which control transmission gate T5, is activated only when address informing signals PTi, QTi, and RTi are at high levels, which has turned on NMOS transistors NM1 to NM3. Meanwhile, another complementary pair of selection control signals BKLBi and BKHBi, which control transmission gate T7, is activated only when other address informing signals PBi, QBi, and RBi are at high levels, which has turned on NMOS transistors NM6 to NM8. The two groups of the address informing signals may be independently created from their senior address signals, which are involved in the selection of memory block BKi including the top and bottom blocks. After designating a memory block (e.g., BKi) which includes the top and bottom blocks in a reading operation, they do not activate the top and bottom blocks simultaneously. Hence, transmission gates T5 and T7 can not enabled at the same time. Basically, even though the block and ground selection lines are designed to be shared by the neighboring blocks, it would be undesirable to also activate an neighboring block.

Different sets of lines must be activated to address different blocks. In addition, all other groups are preferably deactivated, which is also known as disabled. A table is shown in FIG. 7. In the table of FIG. 7, the meaning of "Valid" is that the signals are in the state of an alternatively selectable mode; for instance, when BKTi is selected, one of GSLi−1<0> and GSLi<1> may be activated in accordance to where a selected memory cell is located, and, also, one of wordlines WLTn through WLT0 is selected therein.

In a read operation, regarding when memory cell MT1n of the top block BKTi is selected and is an on-cell, the sensing current for the selected memory cell flows from main bitline MBL1 to main bitline (or virtual ground line) MBL2 through selection transistor BSO1, sub-bitline SBL1, the channel path of the memory cell MT1n, and selection transistor BSE1. Wordline WLTn out of WLTn through WLT0 goes to a high level during the read operation for BKTi. For the purpose of forming the sensing current path, BSLi<1> and GSLi<1>should be charged at high levels, to turn on the selection transistors BSO1 and BSE1. Referring to FIG. 3A, since the top block BKTi is selected, address informing signals PTi, QTi, RTi, for designating BKTi, are all at high levels, and thereby selection control signals BKLTi and BKHi are at low and high levels respectively. Meanwhile selection control signals BKLBi and BKHBi for the bottom block, are at high and low levels, respectively. Then, in FIG. 5A, transmission gates T5 and T6 are turned on, while T7 and T8 are off. Accordingly, BSLi<0> and BSLi<1>, arranged in the bottom block (i.e., BKBi), can not be connected to the valid block selection lines (the original on the right side of FIG. 5A). Discharge circuit 71 is not enabled because BKLTi is low level, even though BKLBi is high level. Similarly, in FIG. 5B, T13 and T14 are turned on while T11 and T12 are off. Accordingly, GSLi−1<0> and GSLi<1>, arranged in the bottom block, (i.e., BKBi−1) can not be connected to the valid ground selection lines (the original on the right side of FIG. 5B).

The discharge circuits 71 and 72 disable the block selection lines. They do that by being be conductive when the selection control signals are all in disable states, i.e. when BKLTi and BKLBi are at high levels. In that case, BKHTi and BKHBi are at low levels, to shut down the transmission gates T5 to T8 and T11 to T14. This makes the block and ground selection lines be pulled down to the substrate voltage (or the ground voltage).

As of another selection feature, if memory cell MT3n of the top block BKTi is selected, the sensing current path is formed between MBL1 and MBL2, through selection transistor BSO2, sub-bitline SBL3, the current path of the selected memory cell MT3n, and selection transistor BSE2, under BSLi<0>and GSLi−1<0>, which are at a high level.

If memory cell MB1n of the bottom block BKBi is selected during a read operation, BSLi<1> and GSLi+1<1> are made conductive, in order to from the sensing current path for the selected memory cell MB1n. However, it should be noted that the BSLi<1> is the one connected thereto through transmission gate T8, which is turned on by enabled BKLBi and BKHBi while T6 is being shut down. The enabled selection control signals BKLBi and BKHBi are generated from the circuit of FIG. 3B, in which address informing signals PBi, QBi, and RBi, for designating BKBi, are all at high levels.

The activation of the selection lines and word lines is controlled by the selection control signals spontaneously in the operation. Referring to FIGS. 4A and 4B, wordline WLTi (i is one of 0 through n) of the top block is connected to its corresponding drive signal SBi through transmission gate T1, which is turned on by the activated selection control signals BKLTi and BKHTi when the top block is selected. Similarly, while wordline WLBi (i is one of 0 through n) of the bottom block is connected to its corresponding drive signal SBi through transmission gate T2, which is turned on by the activated selection control signals BKLBi and BKHBi when the bottom block is selected. And the drive signals are discharged through NMOS transistors NM11 and NM12 to the ground voltage in response to the selection control signals BKLTi and BKLBi, respectively, if their own blocks are not selected.

As described above, it is possible to arrange the selection lines over the neighboring memory blocks in the sharing feature, and to activate or discharge them in an alternative operation. As a result, the circuit area for the memory block activation can be minimized, and the chip size can be reduced.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A memory comprising:

groups of block selection lines, at least a first group being disposed between a first pair of neighboring memory blocks, at least a second group being disposed between a second pair of neighboring memory blocks, at least one block selection line of each group addressing at least one cell in each of the pair of memory blocks that the group is between, wherein the memory cells are coupled to a plurality of wordlines;

a decoding means for selecting one of the first and second groups in response to address informing signals, wherein the decoding means includes:

a switching control circuit for generating selection control signals in response to the address informing signals, a wordline switching circuit coupled between conductors carrying wordline drive signals and the wordlines for enabling, in response to the selection control signals, wordlines that correspond to cells that correspond to the selected group, and a block selection line switching circuit coupled between conductors carrying block selection signals and the block selection lines for enabling, in response to the selection control signals, the block selection lines of the selected group; and a discharge circuit for disabling, in response to the selection control signals, block selection lines of the unselected group.

2. The memory of claim 1, further comprising a discharge circuit for disabling, in response to the selection control signals, wordlines that correspond to cells that correspond to the unselected group.

* * * * *

UNITED STATES PATENT AND TRADEMARK OFFICE
CERTIFICATE OF CORRECTION

PATENT NO. : 6,252,817 B1
DATED : June 26, 2001
INVENTOR(S) : Seo et al.

It is certified that error appears in the above-identified patent and that said Letters Patent is hereby corrected as shown below:

Column 1,
Lines 51-53, "coupled between the block selection line signals and the conductors block selection carrying lines." should read -- coupled between conductors carrying the block selection line signals and the block selections lines. --.

Column 4,
Line 33, "pulls own" should read -- pulls down --.
Line 35, "hen" should read -- when --.
Line 43, "KLTi" should read -- BKLTi --.

Column 5,
Line 60, "BSOI" should read -- BSO1 --.

Column 6,
Line 23, "current path" should read -- channel path --.

Signed and Sealed this

Sixth Day of August, 2002

Attest:

Attesting Officer

JAMES E. ROGAN
*Director of the United States Patent and Trademark Office*